US012757613B2

(12) United States Patent
Yang et al.

(10) Patent No.: US 12,757,613 B2
(45) Date of Patent: Oct. 6, 2026

(54) DISPLAY PANEL AND DISPLAY APPARATUS

(71) Applicants: Chengdu BOE Optoelectronics Technology Co., Ltd., Chengdu (CN); BOE TECHNOLOGY GROUP CO., LTD., Beijing (CN)

(72) Inventors: Lulu Yang, Beijing (CN); Zhenhua Zhang, Beijing (CN); Huijun Li, Beijing (CN); Tinghua Shang, Beijing (CN); Xiaofeng Jiang, Beijing (CN); Xin Zhang, Beijing (CN); Yupeng He, Beijing (CN); Hao Zhang, Beijing (CN); Yi Qu, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 659 days.

(21) Appl. No.: 17/920,766

(22) PCT Filed: Mar. 9, 2021

(86) PCT No.: PCT/CN2021/079629
§ 371 (c)(1),
(2) Date: Oct. 21, 2022

(87) PCT Pub. No.: WO2021/213030
PCT Pub. Date: Oct. 28, 2021

(65) Prior Publication Data
US 2023/0172032 A1 Jun. 1, 2023

(30) Foreign Application Priority Data
Apr. 24, 2020 (CN) ........................ 202010330387.2

(51) Int. Cl.
*H10K 59/80* (2023.01)
*H10K 59/122* (2023.01)

(52) U.S. Cl.
CPC ....... *H10K 59/8723* (2023.02); *H10K 59/122* (2023.02)

(58) Field of Classification Search
None
See application file for complete search history.

(56) References Cited

U.S. PATENT DOCUMENTS 8,994,015 B2 3/2015 Pyon et al.
2014/0252321 A1* 9/2014 Pyon .................. H10K 59/122 257/89

(Continued)

FOREIGN PATENT DOCUMENTS

CN 106783927 A 5/2017
CN 107871773 A 4/2018

(Continued)

OTHER PUBLICATIONS

Display Substrate And Display Device (Year: 2018).*

(Continued)

*Primary Examiner* — Khaja Ahmad
(74) *Attorney, Agent, or Firm* — HOUTTEMAN LAW LCC

(57) ABSTRACT

A display panel and a display apparatus. The display panel includes a base layer, a pixel defining layer, red pixels, green pixels, blue pixels, and spacers. The pixel defining layer is on the base layer. The pixel defining layer is formed with a plurality of openings. The red pixels, the green pixels, and the blue pixels are on the base layer. The red pixels, the green pixels, and the blue pixels each are corresponding to (Continued)

one of the openings. The spacers are on the pixel defining layer. The spacers each are between the green pixel and blue pixel adjacent to each other.

16 Claims, 3 Drawing Sheets

(56) References Cited

U.S. PATENT DOCUMENTS

| | | | | |
|---|---|---|---|---|
| 2015/0102320 | A1* | 4/2015 | Jung | H10K 59/353 257/40 |
| 2015/0162391 | A1* | 6/2015 | Kim | H10K 59/122 257/40 |
| 2019/0044077 | A1* | 2/2019 | Zhang | H10D 86/441 |
| 2019/0140030 | A1* | 5/2019 | Huangfu | G09G 3/3233 |
| 2021/0343800 | A1* | 11/2021 | Zhao | H10K 59/35 |

FOREIGN PATENT DOCUMENTS

| | | | | |
|---|---|---|---|---|
| CN | 107871774 | A | 4/2018 | |
| CN | 207883217 | U * | 9/2018 | G02F 1/1333 |
| CN | 109004010 | A | 12/2018 | |
| CN | 110581145 | A | 12/2019 | |
| CN | 110752243 | A | 2/2020 | |
| CN | 110890397 | A | 3/2020 | |
| CN | 111490088 | A | 8/2020 | |
| EP | 2854194 | A1 | 4/2015 | |
| KR | 100793546 | B1 | 1/2008 | |
| WO | WO2019153948 | A1 | 8/2019 | |

OTHER PUBLICATIONS

China Patent Office, First Office Action dated Nov. 25, 2021, for corresponding Chinese application 202010330387.2.

China Patent Office, Second Office Action dated May 6, 2022, for corresponding Chinese application 202010330387.2.

European Patent Office, EESR dated Sep. 11, 2023, for corresponding EP application 21792259.0.

* cited by examiner

DISPLAY PANEL AND DISPLAY APPARATUS

PRIORITY INFORMATION

This is a National Phase Application filed under 35 U.S.C. 371 as a national stage of PCT/CN2021/079629, filed on Mar. 9, 2021, claiming priority and benefit of a patent application No. 202010330387.2 filed to CNIPA on Apr. 24, 2020, the contents of each of which is incorporated herein by reference in its entirety.

TECHNICAL FIELD

The present application relates to the technical field of display, in particular to a display panel and a display apparatus.

BACKGROUND

In recent years, an organic light emitting diode (OLED) display panel has the advantages of a large viewing angle, a small volume, lightness and thinness, a fast response speed, a high light emitting luminance, and the like, and is easy to implement color display and large-screen display, and to implement flexible display, so that the OLED display panel has a wide application prospect.

In the manufacturing process of the organic light emitting diode display panel, pixels of the organic light emitting diode display panel may be formed through a mask through the evaporation process. As a material of pixels may be accumulated on the mask, during the mask moves, a material of red pixels on the mask is prone to scratch a spacer and thus, attached to the spacer to form foreign matter, so that an encapsulation layer of the display panel breaks to cause a phenomenon of relevant defect.

SUMMARY

The present application provides a display panel and a display apparatus.

The display panel according to an embodiment of the present application includes:

- a base layer;
- a pixel defining layer, which is on the base layer and formed with a plurality of openings;
- red pixels, green pixels and blue pixels, which are on the base layer and each are corresponding to one of the plurality of opening; and
- spacers, which are on the pixel defining layer and each are between the green pixel and the blue pixel adjacent to each other.

In some embodiments, a cross-sectional area of each of the spacers is less than 130 square micrometers.

In some embodiments, each of the spacers has a cross-section in a shape of a rectangle, and a size of each side of the rectangle is less than 13 μm.

In some embodiments, the display panel includes a plurality of spacer units, which are arranged periodically and each include several of the spacers.

In some embodiments, a distance between any two spacers in each of the plurality of spacer units is in a range of 100 μm to 500 μm.

In some embodiments, a ratio of a total cross-sectional area of the spacers to an area of an active area of the display panel is less than 0.5%.

In some embodiments, each of the plurality of spacer units includes four spacers, the four spacers enclose in a diamond shape, two arranged diagonally ones of the four spacers are arranged along an extending direction of a first side of the display panel, and the other two spacers of the four spacers are arranged along an extending direction of a second side of the display panel, and the first side is connected to the second side.

In some embodiments, each of the spacers has a rectangular cross-section, and includes a first edge and a second edge opposite to the first edge, and in the green pixel and the blue pixel, which are adjacent to the spacer, a light emitting region of the green pixel includes a third edge parallel and opposite to the first edge, and a light emitting region of the blue pixel includes a fourth edge parallel and opposite to the second edge.

In some embodiments, a distance between the first edge and the third edge is equal to a distance between the second edge and the fourth edge.

In some embodiments, a distance between the first edge and the third edge is greater than 4 micrometers; and/or a distance between the second edge and the fourth edge is greater than 4 micrometers.

In the display panel and the display apparatus according to the embodiment of the present application, the spacer is located between the green pixel and the blue pixel adjacent to each other, so that the material of the red pixel on the mask may be prevented from scratching the spacer to cause the material of the red pixel to be attached to the spacer in the evaporation process, the material of the pixel is prevented from being accumulated on the spacer, and therefore, the encapsulation layer of the formed display panel is prevented from breaking which results in a phenomenon of relevant defect, and a yield of the display panel 100 is improved.

Additional aspects and advantages of the embodiment of the present application will be set forth in part in the following description, will become apparent in part from the following description, or may be learned by practice of the embodiment of the present application.

BRIEF DESCRIPTION OF DRAWINGS

The above and/or additional aspects and advantages of the present application will become apparent and readily appreciated from the following description of the embodiment in conjunction with the accompanying drawings, in which.

Figure 1:
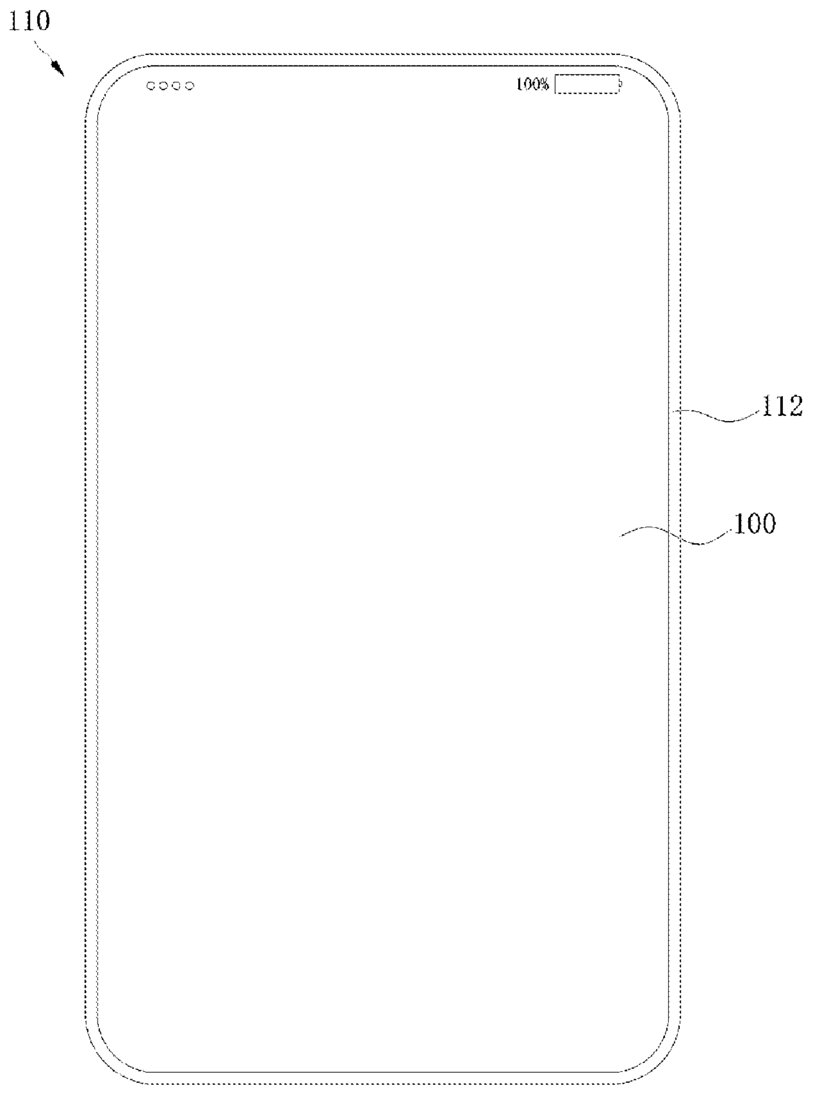
FIG. 1 is a schematic plan view of a display apparatus according to an embodiment of the present application.

DESCRIPTION OF REFERENCE CHARACTERS OF MAIN FEATURES a display panel 100, a display apparatus 110, a housing 112, a base layer 10, a pixel defining layer 20, an opening 21, a red pixel 30, a green pixel 40, a third edge 41, a blue pixel 50, a fourth edge 51, a spacer 60, a spacer unit 61, a first edge 62, a second edge 63, a mask 120, a first side 102, a second side 104.

DETAIL DESCRIPTION OF EMBODIMENTS

Description will be made in detail below to embodiments of the present application, examples of which are illustrated in the accompanying drawings, where same or similar reference characters refer to the same or similar elements or elements having the same or similar functions throughout. The embodiments described below with reference to the accompanying drawings are exemplary only for explaining the present application and are not to be construed as limiting the present application. The following disclosure provides many different embodiments or examples to implement different structures of the present application. To simplify the disclosure of the present application, components and arrangements of specific examples are described below. Of course, they are merely examples and are not intended to limit the present application. Further, the present application may repeat reference numerals and/or reference letters in the various examples for simplicity and clarity and does not in itself dictate a relationship between the various embodiments and/or arrangements discussed. In addition, examples of various specific processes and materials are provided herein, but one of ordinary skill in the art may recognize the application of other processes and/or the use of other materials.

With the development of display technology, the application of an organic light emitting diode (OLED) display panel is becoming more and more extensive. The manufacturing process of the OLED display panel is relatively complicated, and design optimization is very important for improving the yield of products. In the manufacturing process of the OLED display panel, it is required in one step of the process to evaporate an electroluminescent material at openings of a pixel defining layer (PDL). Because materials of different colors need to be evaporated in different pixels in the evaporation process, a mask is needed to limit an evaporation range of the electroluminescent material.

In an actual process, the mask is used for a long time, an electroluminescent material with a certain thickness is necessarily accumulated on a surface of the mask after the mask is used for a period of time. When the mask and a back plane are aligned and adjusted, a position of the mask is continuously and minutely adjusted in each direction, therefore a phenomenon of a scratch between the mask and a spacer inevitably occurs. The electroluminescent material is accumulated at an edge of an opening in the mask due to the previous deposition process, so that the electroluminescent material of the red pixel is prone to adheres to the spacer during the scratch, forming a foreign matter having a thickness in a range of approximately 0.8 μm to 1.5 μm. In a subsequent encapsulation process, an inorganic material of a first encapsulation layer has a thickness in a range of 0.5 μm to 0.9 μm, and due to the existence of the foreign matter, the first encapsulation layer inevitably breaks at the position where the foreign matter is accumulated so that it is difficult to form a complete layer. The subsequent encapsulation process may only be carried out on a surface and cannot improve the topography of the broken position. In a reliability test or a high temperature and high humidity use environment, water vapor is prone to enter the display panel through the broken position of the first encapsulation layer, so that a device is failed and a defect is formed.

Referring to FIG. 1, a display panel 100 is provided in the present application. The display panel 100 according to an embodiment of the present application may be used in a display apparatus 110. The display apparatus 110 is an electronic product with a display function, such as a virtual reality device, a mobile phone, a television, a tablet computer, a wearable watch, a notebook computer, a computer monitor, an IoT (internet of things) node, or the like. The display apparatus 110 shown in FIG. 1 is a mobile phone, which is only one form of the display apparatus 110, and should not be construed as limiting the present application.

The display apparatus 110 may include a housing 112, and the display panel 100 may be arranged in the housing 112. The housing 112 may protect the display panel 100, and reduce an impact on the display panel 100.

Figure 2:
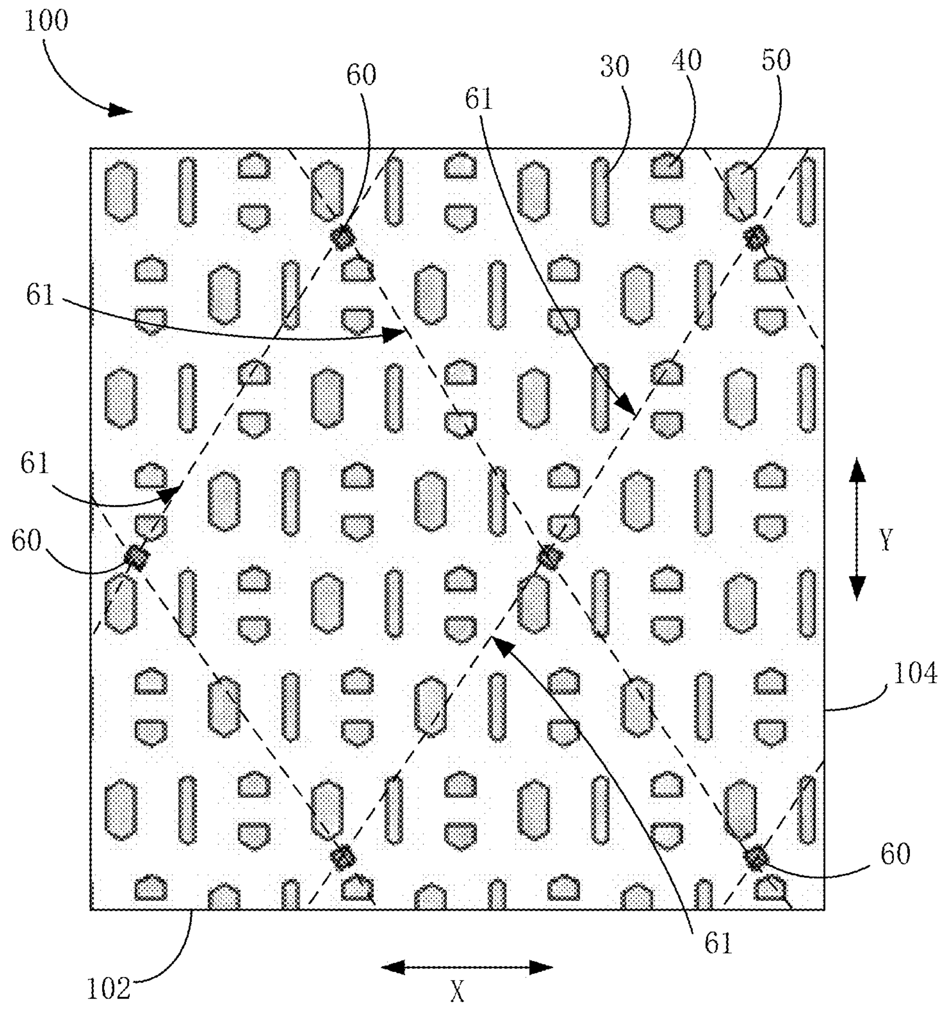
FIG. 2 is a schematic plan view of a display panel according to an embodiment of the present application.
Figure 3:
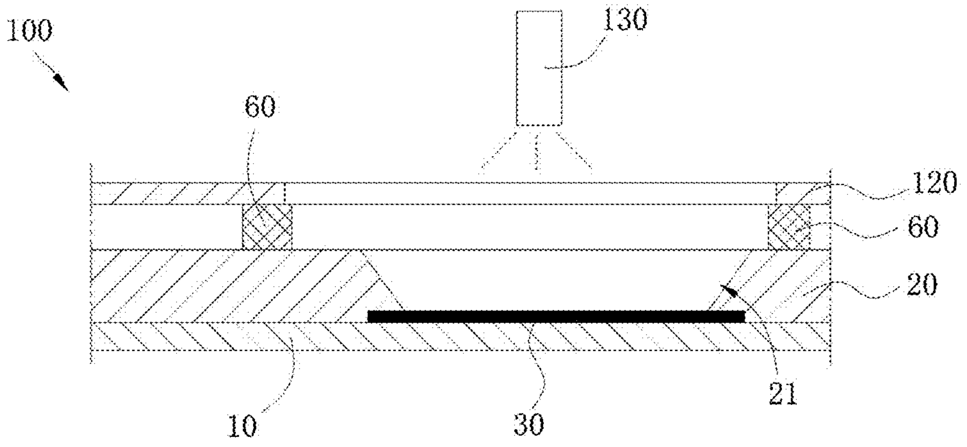
FIG. 3 is a schematic cross-sectional view of a display panel according to an embodiment of the present application.
Figure 4:
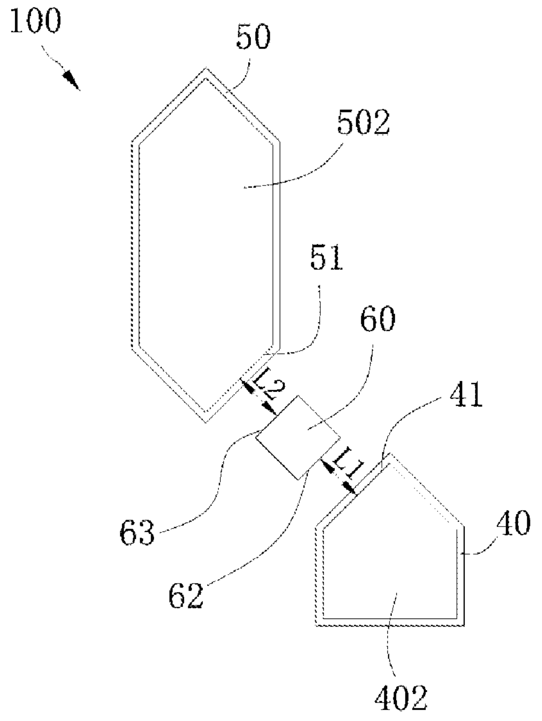
FIG. 4 is a schematic view of a part of a structure of a display panel according to an embodiment of the present application.

Referring to FIGS. 2 to 4, a display panel 100 according to an embodiment of the present application includes a base layer 10, a pixel defining layer 20, a red pixel 30, a green pixel 40, a blue pixel 50, and a spacer 60. The pixel defining layer 20 is arranged on the base layer 10. The pixel defining layer 20 is formed with a plurality of openings 21. The red pixel 30, the green pixel 40, and the blue pixel 50 are formed on the base layer 10. The red pixel 30, the green pixel 40, and the blue pixel 50 each are arranged corresponding to the opening 21. The spacer 60 is arranged on the pixel defining layer 20. The spacer 60 is located between the green pixel 40 and the blue pixel 50 adjacent to each other.

In the display panel 100 and the display apparatus 110 according to the embodiment of the present application, the spacer 60 is located between the green pixel 40 and the blue pixel 50 adjacent to each other, so that the material of the red pixel on the mask 120 may be prevented from scratching the spacer 60 to cause the material of the red pixel to be attached to the spacer 60 in the evaporation process, the material of the pixel is prevented from being accumulated on the spacer 60, and therefore, the encapsulation layer of the formed display panel 100 is prevented from breaking which results the phenomenon of relevant defect, and the yield of the display panel 100 is improved.

Specifically, the display panel 100 may be an OLED display panel, and further, the display panel 100 may be an active-matrix organic light emitting diode (AMOLED) display panel. The display panel 100 has characteristics of lightness and thinness, flexibility, and the like, and may be widely applied to various display apparatuses 110 such as a mobile phone, a television, or the like.

The base layer 10 is a carrier of the display panel 100, and may serve for support, protection, and the like. The base layer 10 may be made of glass, polymer material, or the like. The base layer 10 may be formed with a thin film transistor array, a planarization layer, etc., which are well known to one of ordinary skill in the art and will not be described again herein.

The plurality of openings 21 in the pixel defining layer 20 enable pixels of various colors to be formed on the base layer 10 through the evaporation process, thereby avoiding an occurrence of phenomena of defects such as short-circuiting or the like in the pixels of the various colors. The opening 21 may be formed by exposure, etching, or the like. A cross-section of the opening 21 may be diamond-shaped, rectangular, or the like, and the opening 21 may be formed according to a specific shape of each pixel. A side surface of the opening 21 may be an oblique side surface or a vertical side surface.

The red pixel 30, the green pixel 40, and the blue pixel 50 may be formed through the evaporation process. In one example, a mask 120 may be placed on the spacers 60, and then, an electroluminescent material may be formed by an evaporation source 130, and the electroluminescent material may pass through the mask 120 and the openings 21 and then be attached to the base layer 10 to form pixels. The red pixels 30, the green pixels 40, and the blue pixels 50 in a regular arrangement may be finally formed by repeatedly evaporating electroluminescent materials of different emission colors.

The red pixels 30, the green pixels 40, and the blue pixels 50 are exposed through the openings 21 so that light emitted from the red pixels 30, the green pixels 40, and the blue pixels 50 may emit out of the display panel 100 through the openings 21, ensuring that the display panel 100 operates normally.

A red pixel 30, a green pixel 40, and a blue pixel 50 may form a pixel unit, which is a minimum repeating unit of a pixel arrangement structure of the display panel 100. The pixel units may be repeatedly arranged in a certain format to form the pixel arrangement structure of the display panel 100.

For example, each pixel unit may include one red pixel 30, two green pixels 40, and one blue pixel 50, which four pixels are distributed in a triangle. The plurality of pixel units may be arranged in a matrix.

The spacer 60 protrudes from the pixel defining layer 20, in other words, the spacer 60 extends from the pixel defining layer 20 in a direction away from the base layer 10. The spacer 60 may be made of plastic or the like. Further, the spacer 60 may be fixed on the pixel defining layer 20 by bonding or one-piece molding. In one example, a layer may be firstly formed on the base layer 10, and then the materials of the layer is removed by etching or exposing to form the pixel defining layer 20 and the spacers 60, so that the spacers 60 and the pixel defining layer 20 have a one-piece structure.

The spacer 60 is located between the green pixel 40 and the blue pixel 50 adjacent to each other, which means a positional relationship between the spacer 60, and the green pixel 40 and the blue pixel 50 in a direction (XY plane) perpendicular to a thickness direction of the pixel defining layer 20, as shown in FIG. 2. The spacers 60 and the green pixels 40 may be located at different positions in the thickness direction of the pixel defining layer 20.

In some embodiments, a cross-sectional area of the spacer 60 is less than 130 square micrometers ($\mu m^2$), for example, the cross-sectional area of the spacer 60 is 120, 110, or 100 square micrometers. Thus, the cross-sectional area of the spacer 60 is smaller, so that the probability that the spacer 60 scratches the mask 120 is smaller, the probability of a phenomenon of defect caused by foreign matter in the manufacturing process of the display panel 100 is reduced, and the yield of the display panel 100 is improved.

It should be noted that the cross-sectional area of the spacer 60 means that a spacer 60 is cut by an imaginary plane parallel to the base layer 10 to form a cross-section, and an area of this cross-section is the cross-sectional area of the spacer 60.

In some embodiments, the spacer 60 has a cross-section in a shape of rectangle, and each side of the rectangle is less than 13 micrometers (μm). Thus, a whole size of the spacer 60 is less, and the probability that the spacer 60 scratches the mask 120 may be reduced. The cross-section of the spacer 60 may be square or rectangular. Each side of the cross-section of the spacer 60, for example, has a size of 12, 11, 10, or 9 micrometers, or the like. In one example, the spacer 60 has a square cross-section with a side of 10 micrometers.

As shown in FIG. 2, in some embodiments, a plurality of spacers 60 form a spacer unit 61, a plurality of spacer units 61 are provided, and arranged periodically. Thus, the spacers 60 are easily arranged on the pixel defining layer 20, and the manufacturing cost of the display panel 100 is reduced. One spacer unit 61 may include 3, 4 or 5 spacers 60, or the like. In addition, the number of the spacer units 61 may be determined according to a size of the display panel 100. The spacer units 61 may be arranged in rows and columns. In the embodiment of the present application, any two spacers 60 are arranged at an interval, in other words, a certain distance exists between any two spacers 60.

It should be noted that two adjacent spacer units 61 may include a common spacer 60.

In some embodiments, a distance between any two spacers 60 in each spacer unit 61 is in a range of 100 μm to 500 μm. Alternatively, the distance between any two spacers 60 is greater than or equal to 100 micrometers and less than 500 micrometers. With the above range for the spacers 60, the spacers 60 may not only stably support the masks 120, but also reduce a distribution density of the spacers 60, thereby reducing the probability that the spacers 60 scratches the mask 120 to cause the light emitting materials to be attached to the spacers 60, and reducing a defective rate of the display panel 100.

Further, in a case where the distance between any two spacers 60 satisfies the above discussion, in some embodiments, a ratio of a total cross-sectional area S1 of the spacers 60 to an area S2 of an active area (AA) of the display panel 100 is less than 0.5%. For example, given that the number of the spacers 60 is 10, and the cross-sectional area of each spacer 60 is 100 square micrometers, the total cross-sectional area of the spacers 60 is 1000 square micrometers, and the area of the active area of the display panel 100 is 400000 square micrometers, then $S1/S2=1000/400000=0.25\%<0.5\%$.

Therefore, the distribution density of the spacers 60 is low, so that the probability that the luminescent material is attached to the spacers 60 due to the mask 120 scratching the spacers 60 may be reduced, and the defective rate of the display panel 100 is reduced.

It should be understood that the active area (AA) of the display panel 100 is an area where the display panel 100 may effectively display contents, and the active area is generally located in a middle area of the display panel 100.

In some embodiments, each spacer unit 61 includes four spacers 60, and the four spacers 60 enclose in a diamond shape. Two spacers 60 arranged diagonally are arranged along an extending direction of a first side 102 of the display panel 100, the other two spacers 60 are arranged along an extending direction of a second side 104 of the display panel 100, and the first side 102 is connected to the second side 104. Thus, the arrangement of the spacers 60 is simple, which is beneficial for the spacers 60 to be arranged on the pixel defining layer 20.

Specifically, among the four spacers 60 of the spacer unit 61, a distance between any two spacers 60 is in a range of 100 to 500 micrometers. For example, the distance between two spacers 60 arranged diagonally is 100, 200, 300, 400, or 500 micrometers, or the like.

Where the display panel 100 is a rectangular panel, the first side 102 may be a width side of the display panel 100, and the second side 104 may be a length side of the display panel 100.

In some embodiments, the spacer 60 has a rectangular cross-section, and the spacer 60 includes a first edge 62 and a second edge 63 opposite to the first edge 62. In the green pixel 40 and the blue pixel 50 adjacent to the spacer 60, the light emitting region 402 of the green pixel 40 includes a third edge 41 arranged parallel and opposite to the first edge 62, and the light emitting region 502 of the blue pixel 50 includes a fourth edge 51 arranged parallel and opposite to the second edge 63.

Thus, a distance between the edge of the spacer 60 and each of the green pixel 40 and the blue pixel 50 is relatively long, so that it may be reduced in the evaporation process that the spacer 60 scratches the blue electroluminescent material and the green electroluminescent material accumulated on the mask 120 to cause the electroluminescent material be attached to the spacer 60, and the defective rate of the display panel 100 is reduced.

Specifically, in the example shown in FIG. 4, the blue pixel 50 has a hexagonal shape with a central symmetry, and the green pixel 40 has a pentagonal shape with a left-right symmetry. The third edge 41 and the fourth edge 51 are parallel and opposite to each other. The first edge 62, the second edge 63, the third edge 41, and the fourth edge 51 are all arranged obliquely with respect to a lateral direction of the display panel 100.

Further, a distance L1 between the first edge 62 and the third edge 41 is equal to a distance L2 between the second edge 63 and the fourth edge 51 (L1=L2). Therefore, for the green pixel 40 and the blue pixel 50 adjacent to each other, a distance between the green pixel 40 and the spacer 60 is equal to a distance between the blue pixel 50 and the spacer 60, so that the spacer 60 is prevented from being close to one of the green pixel 40 and the blue pixel 50 to cause an interference between the spacer 60 and this pixel.

In some embodiments, the distance L1 between the first edge 62 and the third edge 41 is greater than 4 micrometers (L1>4 μm); alternatively, the distance L2 between the second edge 63 and the fourth edge 51 is greater than 4 micrometers (L2>4 μm); alternatively, the distance L1 between the first edge 62 and the third edge 41 is greater than 4 micrometers (L1>4 μm), and the distance L2 between the second edge 63 and the fourth edge 51 is greater than 4 micrometers (L2>4 μm).

For example, L1 is 5, 6, or 7 micrometers, or the like. L2 is 5, 6 or 7 micrometers, or the like. L1 and L2 are not limited herein.

It should be noted that the terms "first" and "second" in the features of the first edge 62, the second edge 63, and the like are used for descriptive purposes only and are not to be construed as indicating or implying relative importance or implicitly indicating the number of technical features indicated. Thus, a feature defined by the term "first" or "second" may explicitly or implicitly include one or more features. In the description of the present application, the term "a plurality of" means two or more unless specifically limited otherwise.

In the description of this specification, the description with reference to the term "one embodiment", "some embodiments", "an illustrative embodiment", "an example", "a specific example", or "some examples" or the like means that a specific feature, structure, material, or characteristic described in connection with the embodiment or example is included in at least one embodiment or example of the present application. In this specification, schematic representations of the above terms do not necessarily refer to the same embodiment or example. Furthermore, the specific feature, structure, material, or characteristic described may be combined in a suitable manner in any one or more embodiments or examples.

While the embodiments of the present application have been shown and described, it will be understood by one of ordinary skill in the art that numerous changes, modifications, substitutions and variations may be made to the embodiments without departing from the principle and spirit of the present application, the scope of which is defined by the claims and their equivalents.

What is claimed is:

1. A display panel, comprising:

a base layer;

a pixel defining layer, which is on the base layer and formed with a plurality of openings;

red pixels, green pixels and blue pixels, which are on the base layer and each are corresponding to one of the plurality of opening; and spacers, which are on the pixel defining layer and each are between the green pixel and the blue pixel adjacent to each other, wherein the display panel comprises a plurality of spacer units, which are arranged periodically and each comprise several of the spacers, and any two adjacent ones of the plurality of spacer units do not overlap each other, wherein each of the plurality of spacer units comprises four spacers, the four spacers enclose in a diamond shape, and the diamond shape extends across eight rows of pixels, one of two arranged diagonally ones of the four spacers is between a first row of pixels and a second row of pixels, and the other one of the two arranged diagonally ones of the four spacers is between a seventh row of pixels and an eighth row of pixels; and the other two spacers of the four spacers are between a fourth row of pixels and a fifth row of pixels, wherein each of the spacers has a rectangular cross-section, and comprises a first edge and a second edge opposite to the first edge, and in the green pixel and the blue pixel, which are adjacent to the spacer, a light emitting region of the green pixel comprises a third edge parallel and opposite to the first edge, and a light emitting region of the blue pixel comprises a fourth edge parallel and opposite to the second edge.

2. The display panel according to claim 1, wherein a distance between any two spacers in each of the plurality of spacer units is in a range of 100 μm to 500 μm.

3. The display panel according to claim 2, wherein a ratio of a total cross-sectional area of the spacers to an area of an active area of the display panel is less than 0.5%.

4. The display panel according to claim 1, wherein a distance between the first edge and the third edge is equal to a distance between the second edge and the fourth edge.

5. The display panel according to claim 1, wherein a distance between the first edge and the third edge is greater than 4 micrometers.

6. The display panel according to claim 1, wherein a cross-sectional area of each of the spacers is less than 130 square micrometers.

7. The display panel according to claim 1, wherein each of the spacers has a cross-section in a shape of a rectangle, and a size of each side of the rectangle is less than 13 μm.

8. A display apparatus, comprising the display panel according to claim 1.

9. The display panel according to claim 1, wherein a distance between the second edge and the fourth edge is greater than 4 micrometers.

10. The display panel according to claim 4, wherein a distance between the second edge and the fourth edge is greater than 4 micrometers.

11. The display apparatus according to claim 8, wherein a distance between any two spacers in each of the plurality of spacer units is in a range of 100 μm to 500 μm.

12. The display apparatus according to claim 11, wherein a ratio of a total cross-sectional area of the spacers to an area of an active area of the display panel is less than 0.5%.

13. The display apparatus according to claim 8, wherein the two arranged diagonally ones of the four spacers are arranged along an extending direction of a first side of the display panel, and the other two spacers of the four spacers are arranged along an extending direction of a second side of the display panel, and the first side is connected to the second side.

14. The display apparatus according to claim 8, wherein a distance between the first edge and the third edge is equal to a distance between the second edge and the fourth edge.

15. The display apparatus according to claim 8, wherein a cross-sectional area of each of the spacers is less than 130 square micrometers.

16. The display panel according to claim 1, wherein the two arranged diagonally ones of the four spacers are arranged along an extending direction of a first side of the display panel, and the other two spacers of the four spacers are arranged along an extending direction of a second side of the display panel, and the first side is connected to the second side.

* * * * *